(12) United States Patent
Mietke

(10) Patent No.: US 12,223,242 B1
(45) Date of Patent: Feb. 11, 2025

(54) SIMULATION LAYER FOR USER INTERFACE DEVELOPMENT

(71) Applicant: SAP SE, Walldorf (DE)

(72) Inventor: Sebastian Mietke, Reilingen (DE)

(73) Assignee: SAP SE, Walldorf (DE)

( * ) Notice: Subject to any disclaimer, the term of this patent is extended or adjusted under 35 U.S.C. 154(b) by 0 days.

(21) Appl. No.: 18/446,049

(22) Filed: Aug. 8, 2023

(51) Int. Cl.
*G06F 30/27* (2020.01)
*G06F 8/38* (2018.01)

(52) U.S. Cl.
CPC ............. *G06F 30/27* (2020.01); *G06F 8/38* (2013.01)

(58) Field of Classification Search
CPC .......... G06N 5/04; G06N 20/00; G06N 20/10; G06N 20/20; G06N 3/12; G06N 5/02; G06F 3/0482; G06F 3/04817; G06F 3/0483; G06F 8/20; G06F 3/04842; G06F 3/0481; G06F 3/04847; G06F 11/36; G06F 17/00; G06F 3/01; G06F 3/0484; G06F 3/04886; G06F 8/33
See application file for complete search history.

(56) References Cited

U.S. PATENT DOCUMENTS

| | | | | |
|---|---|---|---|---|
| 2016/0062622 A1* | 3/2016 | Song | ..................... | G06F 3/0481 |
| | | | | 715/765 |
| 2019/0155462 A1* | 5/2019 | Yu | ......................... | G06F 3/0483 |
| 2020/0316470 A1* | 10/2020 | Yang | ................... | A63F 13/5372 |

* cited by examiner

*Primary Examiner* — Rayeez R Chowdhury
(74) *Attorney, Agent, or Firm* — Fountainhead Law Group, PC

(57) ABSTRACT

Systems and methods simulate changes to a User Interface (UI) of a software application. During a setup phase, elements of an original UI are extracted and copied in a mesh indicating their position. An event is received and determined to be of a type simulating a change to the copied UI element. Changes to the UI (e.g., field grouping/arrangement; field labeling; error message adjustment; others) are then simulated in a synchronous manner to allow for user inspection. Changes to corresponding development objects of the software application implicated by the simulation, may be derived and reported in an asynchronous manner. Some embodiments may automatically apply the determined changes to the corresponding development objects in the development system. Simulation implemented according to embodiments may accelerate the UI development process, by allowing various stakeholders to review proposed changes in a collaborative manner at the design gate (d-gate) or other UI review meeting stage.

20 Claims, 11 Drawing Sheets

FIG. 8

Change:
```
@EndUserText.label: 'Old field Name A'
@UI:{ lineItem: [{ position: 30, importance: #MEDIUM }],
     fieldGroup: [{ qualifier: 'Group A', position: 30 }]}
Field A;
```

To:
```
@EndUserText.label: 'New field Name A'
@UI:{ lineItem: [{ position: 30, importance: #MEDIUM }],
     fieldGroup: [{ qualifier: 'Group A', position: 30 }]}
Field A;
```

FIG. 9

Change:
```
@EndUserText.label: 'Field Name B'
@UI:{ lineItem: [{ position: 30, importance: #MEDIUM }],
     fieldGroup: [{ qualifier: 'Group A', position: 20 }]}
Field B;
```

To:
```
@EndUserText.label: 'Field Name B'
@UI:{ lineItem: [{ position: 30, importance: #MEDIUM }],
     fieldGroup: [{ qualifier: 'Group A', position: 30 }]}
Field B;
```

Change:

```
@EndUserText.label: 'Field Name F'
@UI:{ lineItem: [( position: 20, importance: #MEDIUM )],
      fieldGroup: [( qualifier: 'Group A ', position: 20 )]}
field F;
```

To:

```
@UI.hidden: true
@Consumption.filter.hidden: true
field F;
```

FIG. 10

Change:

```
@EndUserText.label: 'Field Name G'
@UI:{ lineItem: [( position: 20, importance: #MEDIUM )],
      fieldGroup: [( qualifier: 'Group A ', position: 20 )]}
field G;

@EndUserText.label: 'Field Name K'
@UI:{ lineItem: [( position: 30, importance: #MEDIUM )],
      fieldGroup: [( qualifier: 'Group A ', position: 30 )]}
field K;
```

To:

```
@EndUserText.label: 'Field Name G'
@UI:{ lineItem: [( position: 30, importance: #MEDIUM )],
      fieldGroup: [( qualifier: 'Group A ', position: 20 )]}
field G;

@EndUserText.label: 'Field Name K'
@UI:{ lineItem: [( position: 20, importance: #MEDIUM )],
      fieldGroup: [( qualifier: 'Group A ', position: 30 )]}
field K;
```

FIG. 11

```
ls_warning-msgno
APPEND ls_warning

IF field A IS INITIAL.
  ls_warning-msgid = 'MSG_CLASS_NEW'.
  ls_warning-msgno = '005'.
  APPEND ls_warning TO ct_message.
ELSE.
  ls_warning-msgid = 'MSG_CLASS'.
  ls_warning-msgno = '317'.
  APPEND ls_warning TO ct_message.
ENDIF.
```

FIG. 12

SIMULATION LAYER FOR USER INTERFACE DEVELOPMENT

BACKGROUND

Unless otherwise indicated herein, the approaches described in this section are not prior art to the claims in this application and are not admitted to be prior art by inclusion in this section.

The User Interface (UI) of a software application is important, as it is the outward facing component with which users must be comfortable. The development of a UI can be a complex process, taking place over multiple iterations with a variety of stakeholders such as: software developers, UI-designers, and User experience (UX)-designers.

For example, at a design gate (d-gate) meeting, multiple stakeholders may review operation of a UI that is under development, and collaborate to resolve possible issues. The d-gate meeting represents only one example of the iterative complexity of developing user interfaces. Other meetings can also take place during development, such review meetings where a UI that is under development is discussed with a product owner.

SUMMARY

Embodiments relate to systems and methods that simulate changes to a UI of a software application. During a setup phase, elements of an original UI are extracted and copied in a mesh indicating their position. An event is received and determined to be of a type simulating a change to the copied UI element. Changes to the UI (e.g., field grouping/arrangement: field labeling: error message adjustment: others) are then simulated in a synchronous manner to allow for user inspection. Changes to corresponding development objects of the software application that are implicated by the simulation, may be derived and reported in an asynchronous manner. Lastly, some embodiments may automatically apply the determined changes to the corresponding development objects in the development system. Simulation implemented according to embodiments may accelerate the UI development process, by allowing stakeholders to review proposed changes in a collaborative manner at the d-gate (or other) UI review meeting stage.

The following detailed description and accompanying drawings provide a better understanding of the nature and advantages of various embodiments.

BRIEF DESCRIPTION OF THE DRAWINGS

FIG. 8 shows one example of a change in a development object to name a field.

FIG. 9 shows another example of a change in a development object to move a field.

FIG. 10 shows yet another example of a change in a development object to remove a field.

FIG. 11 shows still another example of a change in a development object to switch columns of a table.

FIG. 12 shows another example of UI simulation according to an embodiment.

DETAILED DESCRIPTION

Described herein are methods and apparatuses that implement simulation of a user interface. In the following description, for purposes of explanation, numerous examples and specific details are set forth in order to provide a thorough understanding of embodiments according to the present invention. It will be evident, however, to one skilled in the art that embodiments as defined by the claims may include some or all of the features in these examples alone or in combination with other features described below, and may further include modifications and equivalents of the features and concepts described herein.

Figure 1:
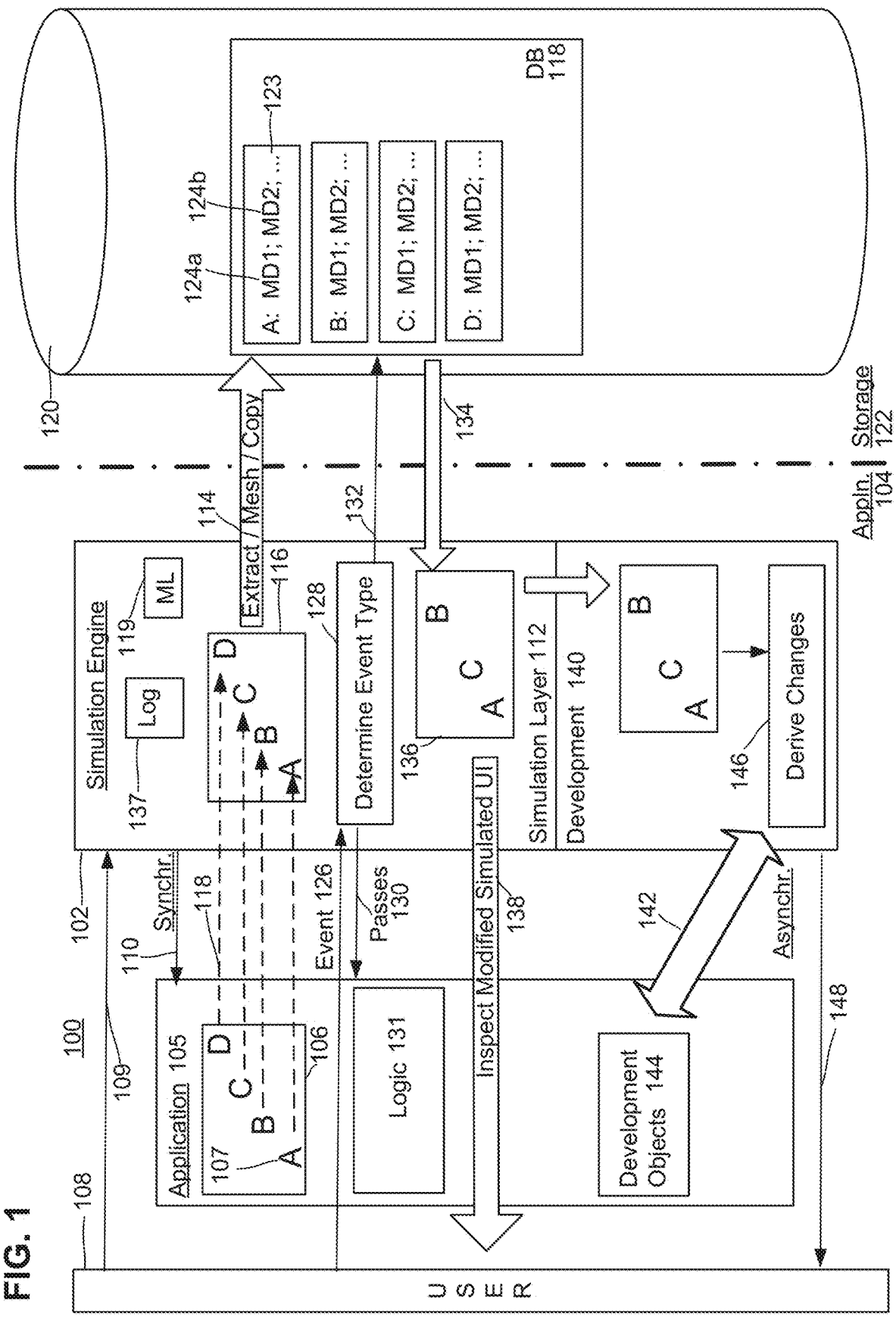
FIG. 1 shows a simplified diagram of a system according to an embodiment.

FIG. 1 shows a simplified view of an example system that is configured to implement alert generation according to an embodiment. Specifically, system 100 comprises a simulation engine 102 located in application layer 104.

A software application 105 having an original UI 106 with respective UI elements 107 (A-D), is also located in the application layer. A user 108 seeks to simulate the UI of the application, by sending a request 109 to the simulation engine.

The simulation engine receives the request. Then, the simulation engine provides instruction 110 in a synchronous manner to the application and proceeds to set up a simulation layer 112.

In particular, this set up 114 may comprise extracting the elements from the original UI, placing those elements in a mesh according to their location, size, and/or type. This creates a copy 116 of the original UI in the simulation layer.

The copy UI is stored in a database 118 of computer readable storage medium 120 that is present in a storage layer 122. The database includes entries 123 (e.g., in row or column form) of various types of metadata (MD) 124a, 124b for each UI element.

For example, as described below the elements of the UI copy may be linked 118 to the elements of the original UI by an identifier which is recorded in a database entry. Another type of metadata in the database can include a location of a particular UI element within the mesh.

In certain embodiments, extraction of elements (e.g., their location, size, and/or type) from the original UI and placing them within a mesh to form the UI copy, can be based upon processing of code of the original UI. According to some embodiments, the UI copy could be formed at least in part by referencing a Machine Learning (ML) capability 119 (to perform, e.g., pattern or image recognition from a training corpus).

Having completed setup of the copy UI from the original UI, the simulation engine next receives an incoming event 126. The simulation engine then determines 128 the type of the event.

The event may be one of two (2) types. A first event type represents an actual interaction of a user with the UI, that seeks to cause activity to occur within the software application. Where the event is determined to be of the first type, the simulation engine simply passes 130 the event on to the software application, for ordinary processing according to logic 131.

However, a second event type represents an interaction with the copy UI of the simulation layer. That is, the user is seeking to simulate modifications to the UI. In certain embodiments, events of the second type may be indicated using a particular form of input (e.g., hotkey or dedicated button)

Where it is determined that a second type of event has in fact been received, the simulation engine communicates 132 with the copy UI present in the storage layer, in order to generate 134 a simulated modified UI 136 therefrom.

In the simplified example of FIG. 1, the event has been determined to simulate:

changes in the position of UI elements B and C within the mesh, and removal of UI element D.

Changes that are simulated to the copy UI may be stored in log 137. In this manner, according to the files of the log, changes to the copy UI of the simulation layer, can be readily rolled back upon demand.

The simulated modified UI is then displayed by the simulation engine. The user can inspect 138 that modified UI and decide in a synchronous manner (e.g., within d-gate) if the modified UI is acceptable to stakeholders.

The simulation engine may also include a development layer 140. There, the simulation engine can reference 142 development objects 144 of the application to derive technical changes 146.

Based upon the technical changes to the development objects resulting from simulated changes to the UI, the simulation engine can return to the user a report 148 documenting those changes. The derivation of technical changes to underlying development objects, and preparation of the corresponding report, may take place asynchronously.

In this manner, the user could be apprised of the scope of changes to underlying objects that are implicated by a simulated change to the UI. This may prove to be valuable information in deciding whether to actually implement a change in the UI that is being simulated at the d-gate level.

Certain embodiments may even apply the changes automatically. There might be different plugins/libraries to support changes of different object types.

Figure 2:
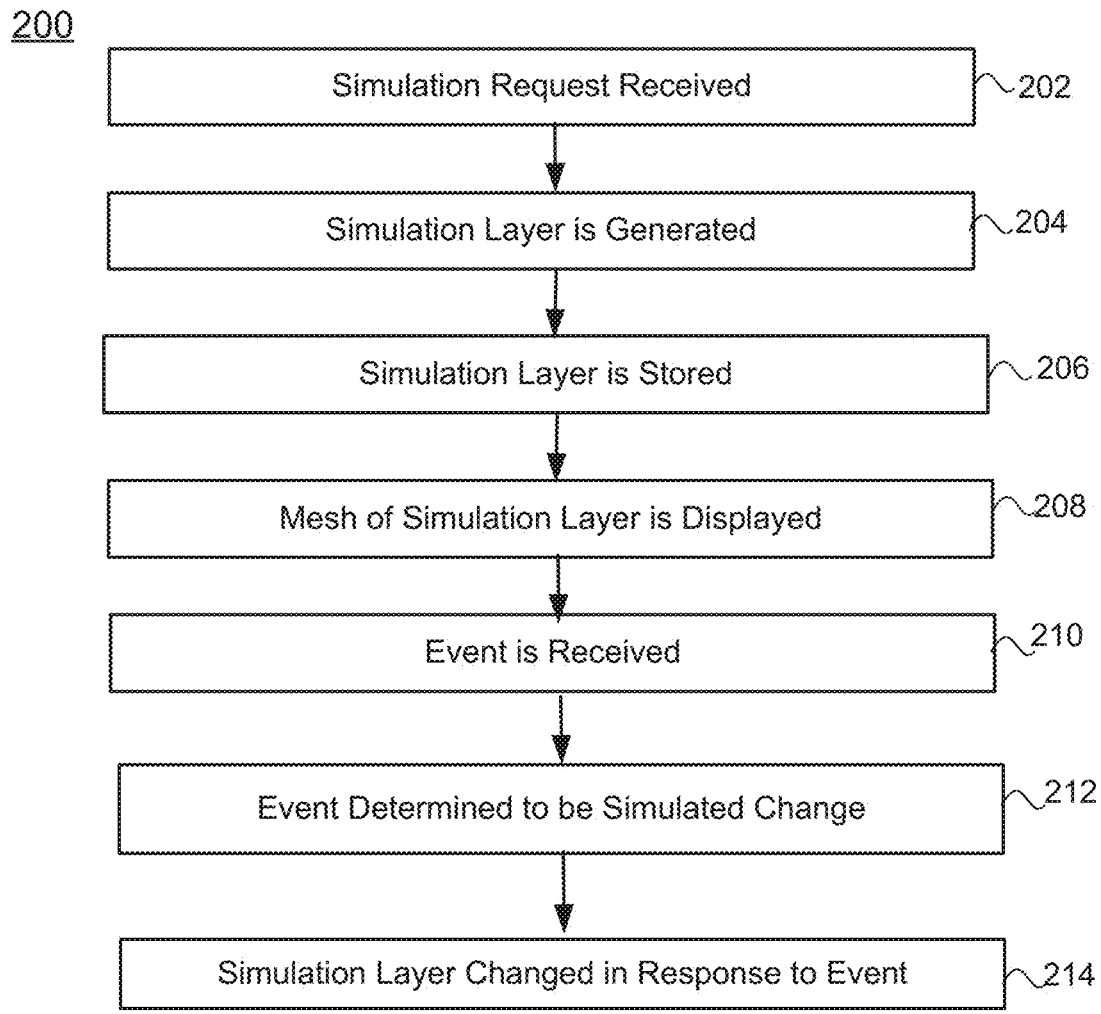
FIG. 2 shows a simplified flow diagram of a method according to an embodiment.

FIG. 2 is a flow diagram of a method 200 according to an embodiment. At 202, a simulation request is received.

At 204, a simulation layer is generated. At 206, the simulation layer is stored.

At 208 a mesh of the simulation layer is displayed. At 210 an event is received.

At 212 the event is determined to be a simulated change. At 214 the simulation layer is changed responsive to the event.

Further details regarding UI simulation according to various embodiments, are now provided in connection with the following example.

Example

Consider a scenario where a new software application has been created (or an existing software application has been changed). Under such circumstances, the corresponding UI of the software application may need to (again) pass through d-gate review.

Figure 3:
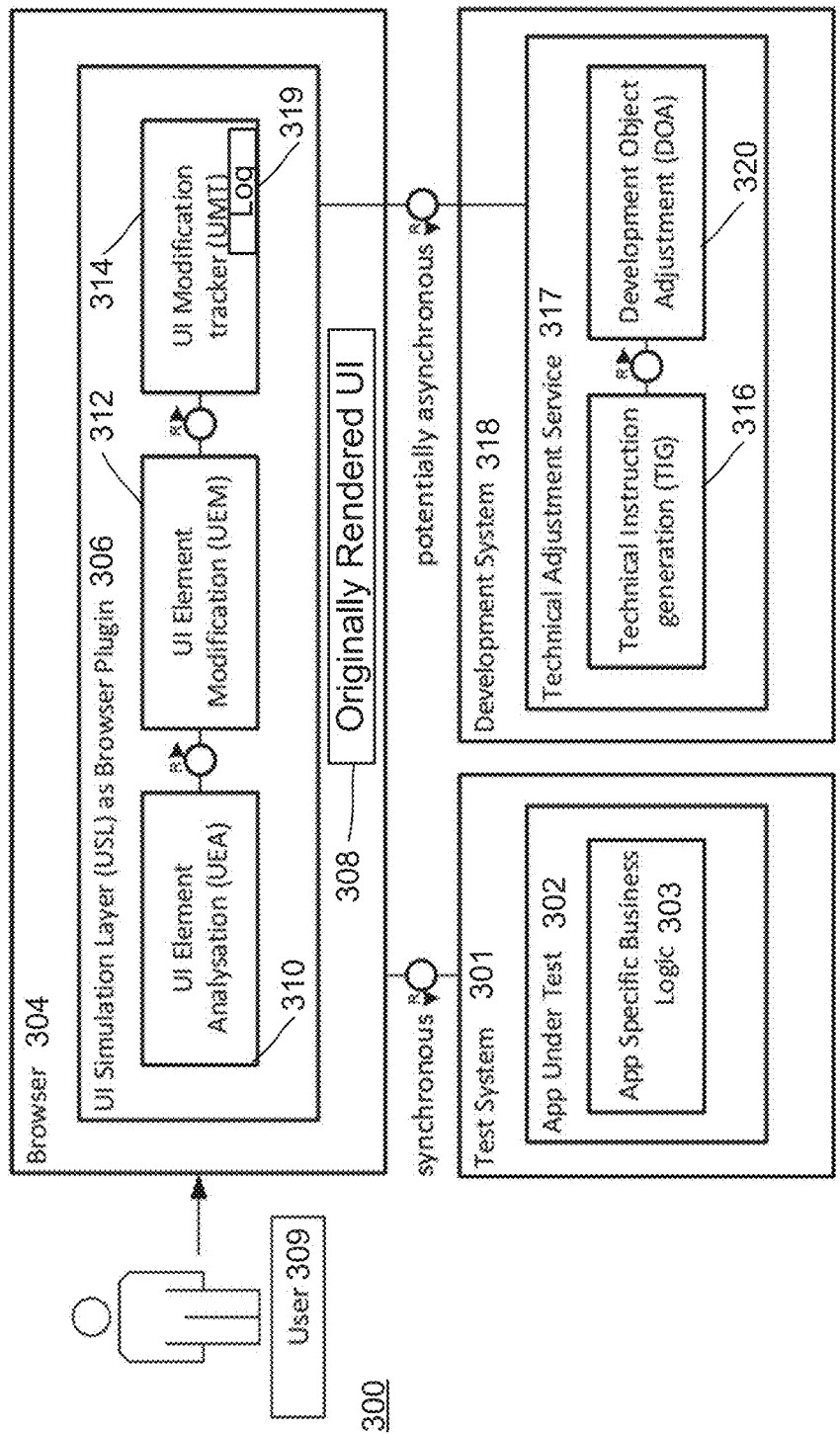
FIG. 3 shows an example of an architecture that is configured to implement UI simulation according to an example.

FIG. 3 shows a simplified view of an architecture 300 according to an example, that is configured to simulate a UI for development purposes. In this example, the software application 302 is named: "App Under Test".

This new App Under Test application is located on a test system 301, and includes specific logic 303. The App Under Test is accessed through a web browser 304.

An additional UI layer 306 is introduced. This additional UI layer is displayed on top of the originally rendered UI 308 of the browser.

This featured new aspect is called the UI Simulation Layer (USL). In this particular example, the USL is implemented as a plugin to a browser.

This new layer is used to simulate changes to the UI. Initially, the graphical representation of the USL is translucent to the user 309.

The UI Element Analyzation (UEA) component 310 provides information about the original UI. Such information can comprise one or more of:

a list of UI elements;

position of UI element on the UI (e.g., within a mesh);

UI element size;

UI element identifier;

UI element type.

Such UI information may be derived by the UEA. In certain embodiments, this can be achieved by analyzing source code of the web page. For some embodiments, the original UI rendered by the browser can be analyzed using machine learning techniques (implementing, e.g., recognition of patterns and/or images).

A mesh is created on the USL according to the information. The USL is sliced in horizontal and vertical direction, so as to create an empty box for each UI element.

For each of the UI elements, a copy is created. The copy is displayed in its corresponding box of the USL.

Figure 4:
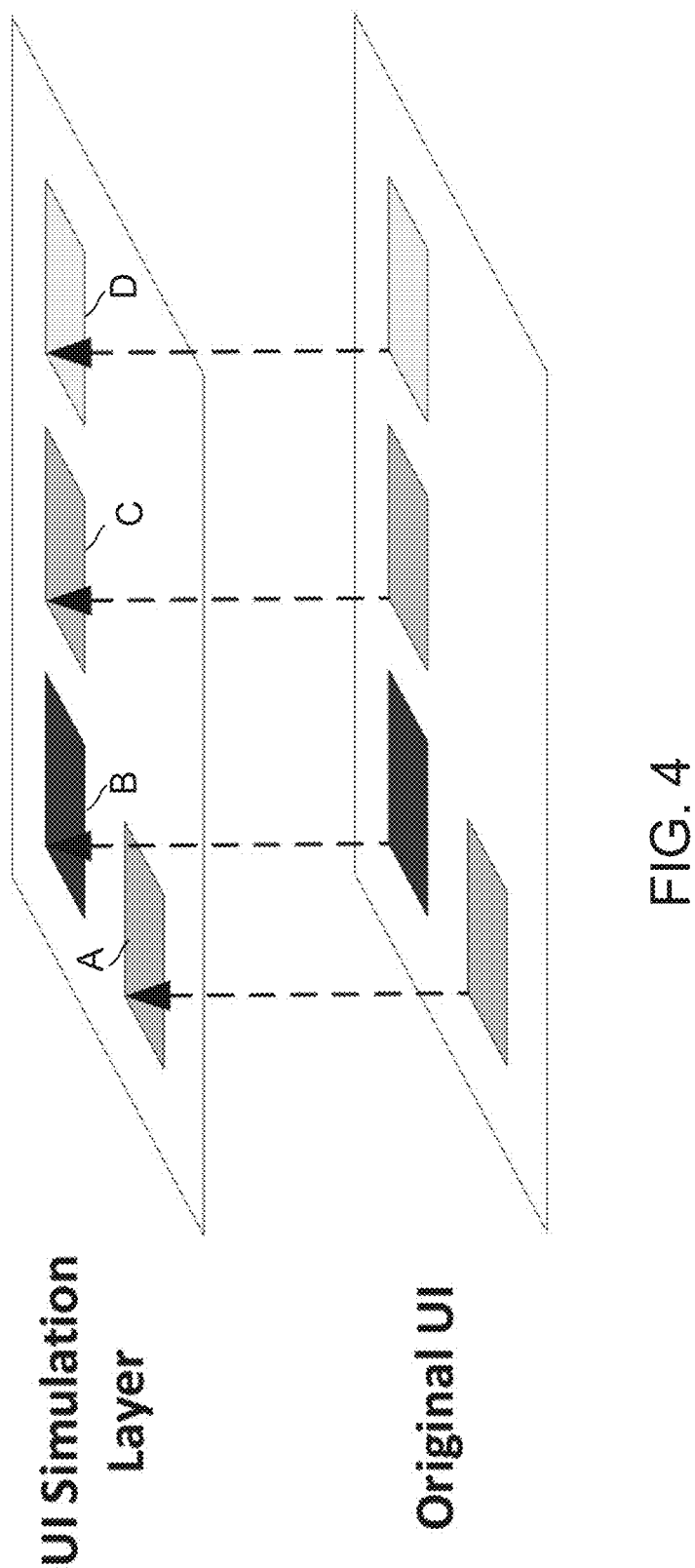
FIG. 4 is a simplified view showing an initial state of a simulation layer according to an example.

FIG. 4 shows a schematic drawing of the USL being displayed on top of the original UI and therefore hiding the original UI. Various elements of the UI being simulated, are shown labeled as A-D.

The original version and the copied version of an UI element may be linked by the technical ID of the original UI element. In FIG. 4, each UI element on the original UI has its copy on the USL. No modifications to the UI have been simulated so far.

Under this approach, the translucent USL now depicts a copy of the UI that was originally rendered by the browser. The USL is displayed on top of the original UI, so that the original UI is covered and therefore hidden behind the copy.

On the USL, events can be triggered using input devices (such as mouse and key board). At least two different types of events may be defined.

On the one hand, there are UI modification events. UI modification events are handled by the UI element modification (UEM) component 312 of FIG. 3.

On the other hand, there are application interaction events. The application interaction events are passed to the original UI, for handling by the App Under Test itself.

These two different event types distinguish between interactions with the USL (done in order to simulate modifications to the UI) and actual interactions with the App Under Test. The user might switch between these two kinds of events (using, e.g., a specific hotkey).

Alternatively, specific buttons could be provided on the USL, to toggle between the two different types of events. As an example, a "Modify UI" button may be used to switch from the application interaction events to the UI modification events. Using a "Save UI" button might toggle the event type vice-versa.

Utilizing such a mechanism, it is known how to interpret input actions (e.g., a mouse-click on the USL.) In UI modification mode, the mouse-click is handled by the UEM. In the application interaction mode, the mouse-click is passed to the original UI, triggering a mouse-click in the app under test.

Figure 5:
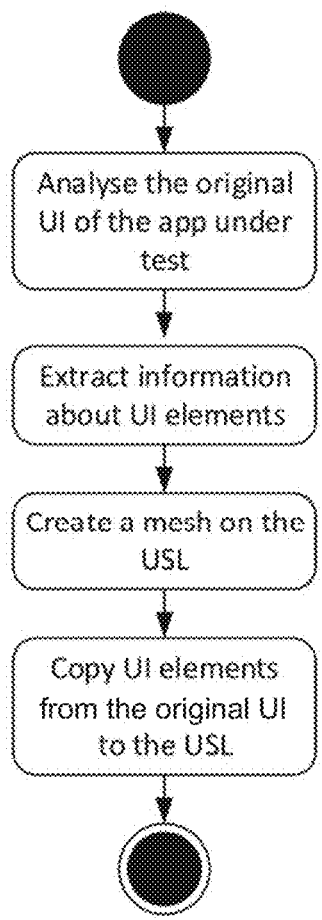
FIG. 5 is a flow diagram showing setup process of the USL in the example.
Figure 6:
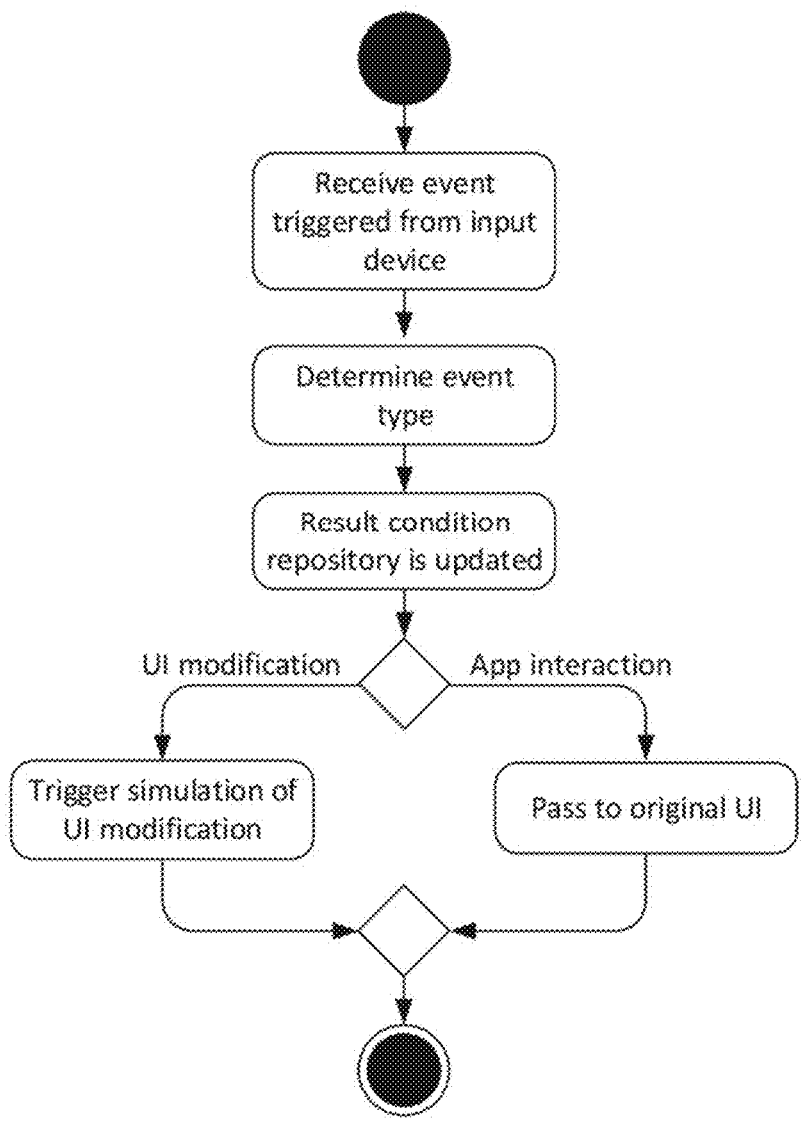
FIG. 6 is a flow diagram showing event handling in the example.

FIG. 5 is a simplified flow diagram showing the setup process of the USL in the example. FIG. 6 is a simplified flow diagram showing event handling in the example.

The UEM component provides functionality to influence the copied UI, displayed in the USL. Whenever a UI modification event is captured, the corresponding UI element of the copied UI is updated.

As an example, the UI element can be selected by a left mouse-click on the corresponding position on the USL. Afterwards, new controls may be displayed dynamically on the USL, depending on the type of the selected UI element.

Thus, a field label might be selected, so a textbox containing the text of the field label will be shown on the USL. The text can now be adjusted by the user. Afterwards, the copied version of the UI element is updated on the USL.

One relevant scenario could be the adjustment of message texts (e.g., from an application log.) Here additional existing APIs can be used (e.g., to retrieve the technical ID of the error message and its parameters.)

Figure 7:
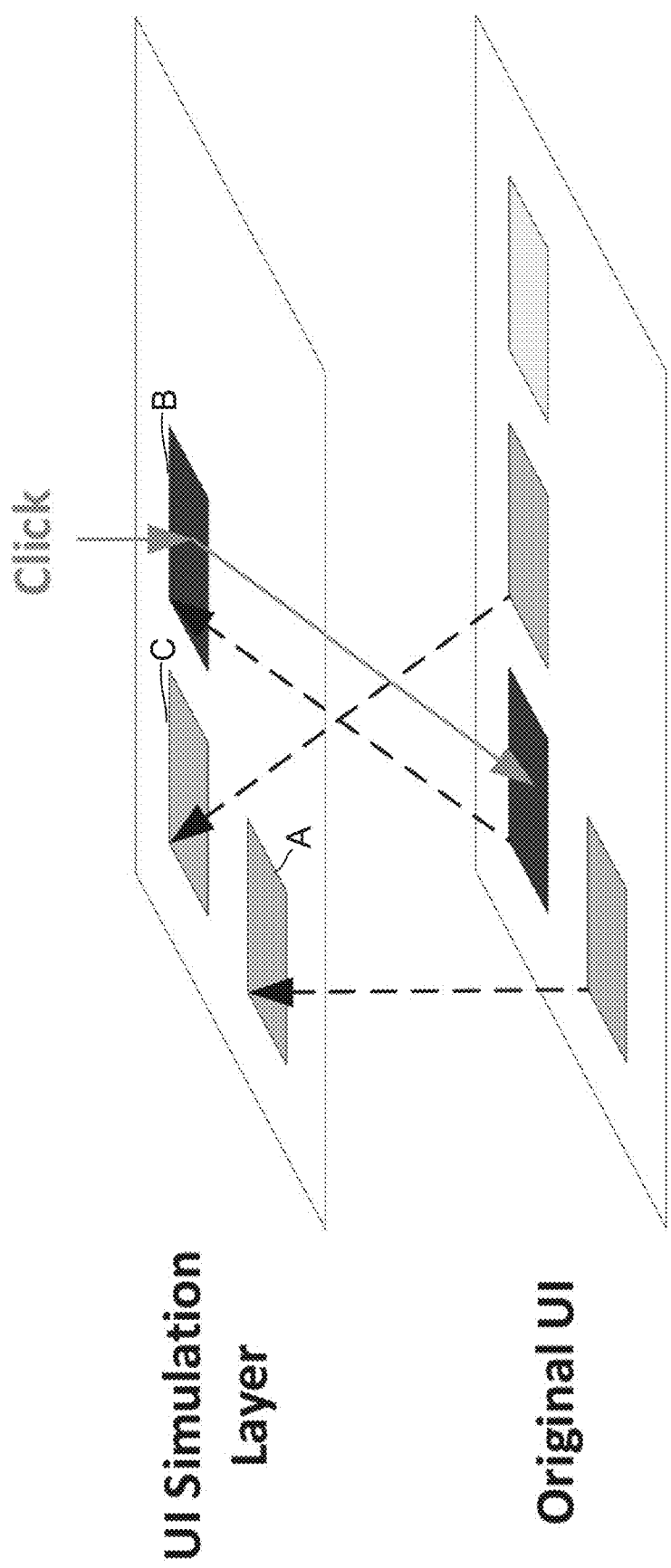
FIG. 7 is a simplified view showing the position of a UI element changed using drag and drop according to the example of FIG. 4.

In another possible scenario, the position of a UI element is changed using drag and drop. This is illustrated in FIG. 7, with reference to the unchanged state of FIG. 4. Specifically, in FIG. 7 the UI element B is picked up (e.g. by a "left mouse button down" event), moved (e.g. by mouse move events) and finally released (e.g. by a "left mouse button up" event).

FIG. 7 shows the resulting display of the USL on top of the original UI and therefore hiding the original UI. The original UI element D has been removed from the USL. Two other UI elements (B and C) have switched their positions in the USL.

If an application interaction event is triggered, it is passed to the correct UI element of the original UI. Here, a mouse-click is performed on the UI element B.

The sample UI modifications described above (renaming fields; moving UI elements) are relatively simple examples, and the basic principles apply to more complex scenarios. The original UI remains intact: simulated changes are visible on the USL.

Modifications on the USL are logged by the UI modification tracker (UMT) 314. This already accelerates the overall development process, since changes can be simulated on the USL. The simulation is local, temporary, and user-specific (since only available in the current browser session). The simulation does not affect the existing productive UI.

Multiple changes can be performed, and if needed can be easily reversed live at runtime. The changes are logged in log 319.

Embodiments may reduce a time of d-gate review. For example, it is not necessary to change the development objects in the development system (and to wait for the transport to the test system), in order to observe the effect on the simulated UI shown in the USL. In this manner, embodiments may avoid multiple iterations of changes and meetings.

It is noted that some embodiments can go further, and derive technical changes of the underlying development objects. This can potentially be done asynchronously, at the end of or even after the design gate meeting. One or more technical instructions might be generated for each logged UI modification.

Returning now to FIG. 3, in this example technical instructions may be created by the Technical Instruction Generation (TIG) component 316 in the Technical Adjustment Service 317 of development system 318. The technical instructions are generated from information provided by the UMT log 319.

Depending upon the particular embodiment, the technical instructions can be executed manually by a developer, and/or executed automatically by specific routines. According to one example, one routine may interpret technical instructions for changing meta-data extension files.

Another routine might be responsible for changing classes. Yet an additional routine may adjust messages (message classes), and so on.

In this way, the overall UI simulation process could be automated to a high degree. These various routines are triggered by the Development Object Adjustment (DOA) component 320.

Both the TIG and the DOA may be located in the development system. They are exposed by the technical adjustment service. This service might be consumed after saving and approving the UI changes performed in the USL.

In the following examples, it is understood that the UI has been simulated successfully during the design gate. Multiple changes have been identified, which have been performed on the USL, to transform the original UI into the correct (from a UX perspective) simulated version.

The UMT has created a log file containing these changes. As a simple example, the log file might consist of the following entries.

Field A has been renamed to "New field name A" (see FIG. 8).
Field B has been moved to Position 30 in group A (see FIG. 7).
Field F has been removed from the UI (see FIG. 7).
The columns G and K of table XY have been switched (see FIG. 11).
The column J of table XY has been removed (see FIG. 10).
The fields M, N, O, P have been grouped by a new box "Grouping criteria".
The text of the error message MSG CLASS (003) has been changed to "New error text".
The error message MSG_CLASS (317) has been changed to MSG_CLASS_NEW (005).
The UI control GEO_LOCATION_MAP has been resized to "WIDTH/HEIGTH".
The header line has been changed to "New header line".

Most of these changes can productively be implemented for the original UI, by adjusting the metadata extension file. Here, existing annotations can be changed and new annotations can be added—for changing field names, positions, groupings and also to toggle the visibility.

According to the example log file, the following technical changes can be generated by the TIG for the meta-data extension file of the consumption CDS view used in the app under test.

FIG. 8 shows one example where a Field A has been renamed to "New field name A".
FIG. 9 shows another example where a Field B has been moved to Position 30 in group A.
FIG. 10 shows yet another example where a Field F has been removed from the UI.

FIG. 11 shows still another example where columns G and K of table XY, have been switched.

Deriving and changing the metadata extension file according to the above examples of FIGS. 8-11, represents just one aspect. Various embodiments could adjust development object(s) other than metadata extension file(s).

Thus in other examples, the error message displayed in the application log is changed. For example, the text of the error message:
MSG_CLASS (003)
has been changed to: "New error text".

The type of the selected UI element on the USL will be "Message". Additional meta-data from the particular message is passed to the USL. This information is also logged by the UMT.

Where messages are stored in table T100, the following technical instruction can be generated by the TIG afterwards:
Change field TEXT of table entry "E MSG_CLASS 003" to "New error text" of the table T100.

Turning to another example, the error message: MSG_CLASS (317), has been changed to MSG_CLASS_NEW (005). Here, the text of the message remains as is, but a different error message should be raised.

Thus the corresponding validation routine must be adjusted. On the USL, the error message in question is selected and the correct error message can be defined.

Thus in the USL, the user can click on the error message. A new context menu could appear with additional options, e.g.:
change text;
change type;
change message class/number;
change existing condition;
add new condition and assign message.

Additional conditions might be specified. For example:
"IF field A IS INITIAL USE msg_class_new (005) ELSE USE msg_class (317)."

In a specific example shown in FIG. 12, a new condition would be added and a new message would be assigned. Validation would be implemented with this.

A human readable statement such as the following could be provided by the user: "If FIELD_A is initial provide message msg_class_new (005), else provide msg_class (317) as usual."

This change is logged by the UMT. So far, the original source code has not been changed.

Then, however, the technical instruction can be created by the TIG as follows. In a first phase, the corresponding validation routine is determined. Basic where-used-checks might be considered.

Additionally, existing behavior definitions—in case of, e.g., the ABAP RESTful Application Programming Model (RAP) applications from SAP SE—may be retrieved and assigned classes might be scanned for the message class and message number. With this, candidates for the validation routine can be found.

The correct line of source code is determined at runtime. The user is prompted to re-trigger the validation (e.g., by triggering a roundtrip or by clicking on the "Check"-button).

The system can now determine which of the previously found candidates is actually responsible for raising the message. In this example, the validation routine is the interface method:
IF_VALIDATOR~VALIDATE_HEADER
implemented in class:
CL_DOCUMENT_VALIDATOR.
The processing of the message in question starts in line 157.

Afterwards, the source code of the validation routine can be adjusted. The following instruction can be generated:
Open method IF_VALIDATOR~VALIDATE_HEADER of the class CL_DOCUMENT_VALIDATOR and go to line 157.
Translation by the TIG into the source code change is shown in FIG. 12.

UI simulation performed according to various embodiments, may offer one or more benefits. Specifically, one possible benefit is increased speed of use. Rather than calling for multiple design gate meetings, proposed UI changes can be simulated and evaluated in a single meeting, with feedback received right away.

Another potential benefit is ease of adoption. Here, the starting point for the UI adjustment is the new UI simulation layer positioned above (and therefore hiding) the original UI layer. This simulation layer provides functionality to simulate UI changes.

Knowledge of the underlying technical development objects is not required. Consequently, the functionality can be used by persons (such as product owners) who are not technical experts in the underlying operating environment in general.

Embodiments may simulate multiple UI changes live at runtime (e.g., during a d-gate meeting). Development effort in the development system is possible but not required during the UI simulation phase. A correct version (from UX perspective) of the UI can be visualized during the meeting, avoiding misunderstandings and enhancing meaningful comparisons.

Returning now to FIG. 3, that particular embodiment features the simulation layer implemented as a plug-in. However, this is not required, and various embodiments could comprise a simulation layer that is implemented through one or more different libraries.

Returning now to FIG. 1, there the particular embodiment is depicted with the simulation engine as being located outside of the database. However, this is not required.

Rather, alternative embodiments could leverage the processing power of an in-memory database engine (e.g., the in-memory database engine of the HANA in-memory database available from SAP SE), in order to perform one or more various functions as described above, including but not limited to one or more of:
setup phase-generating the simulation layer;
modifying the simulation layer in response to events;
deriving changes in development objects; and/or
apply changes to development objects.

Figure 13:
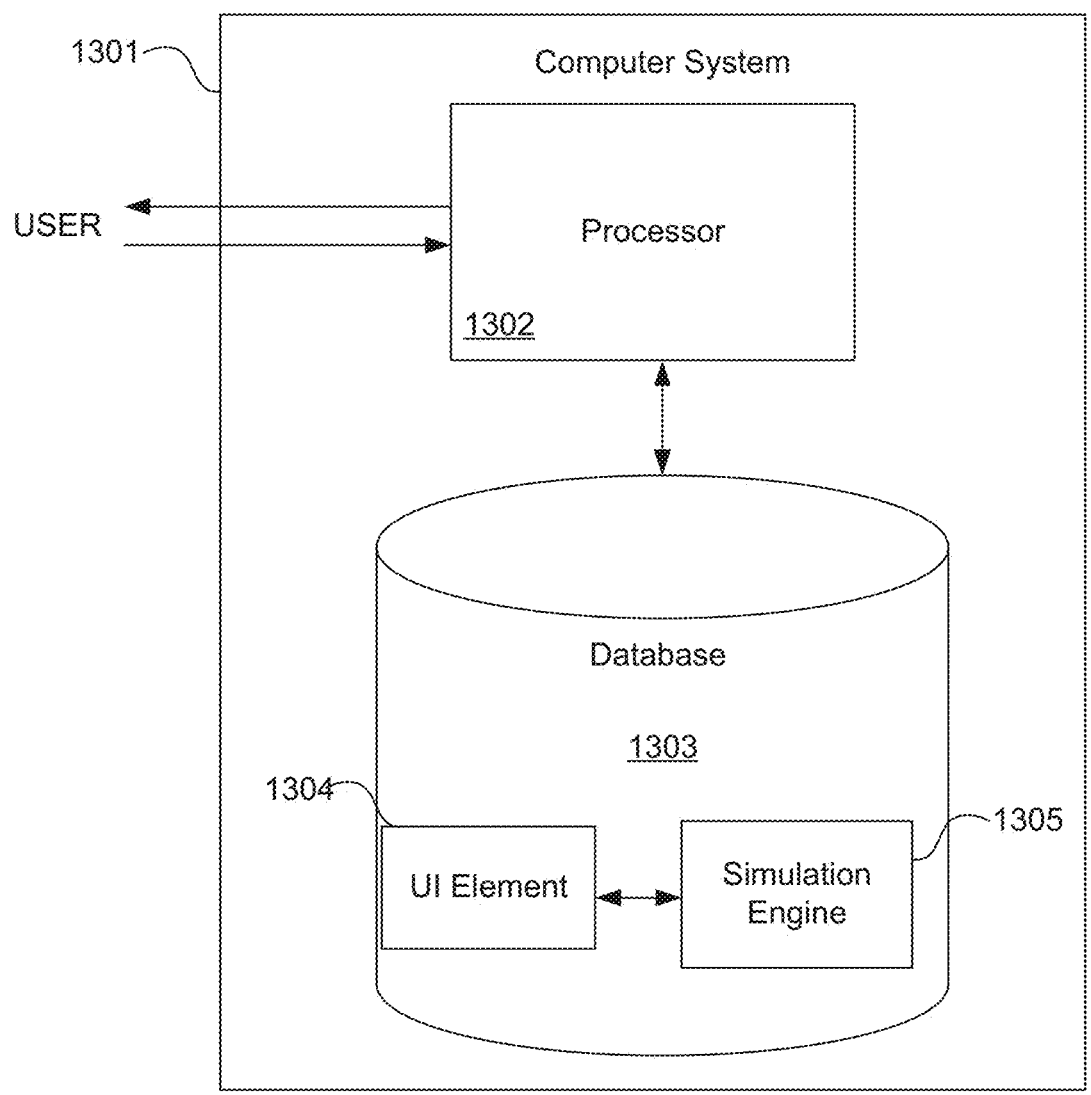
FIG. 13 illustrates hardware of a special purpose computing machine configured to implement UI simulation according to an embodiment.

Thus FIG. 13 illustrates hardware of a special purpose computing machine configured to perform simulation of a UI according to an embodiment. In particular, computer system 1301 comprises a processor 1302 that is in electronic communication with a non-transitory computer-readable storage medium comprising a database 1303. This computer-readable storage medium has stored thereon code 1305 corresponding to a simulation engine. Code 1304 corresponds to a UI element. Code may be configured to reference data stored in a database of a non-transitory computer-readable storage medium, for example as may be present locally or in a remote database server. Software servers together may form a cluster or logical network of computer systems programmed with software programs that communicate with each other and work together in order to process requests.

In view of the above-described implementations of subject matter this application discloses the following list of examples, wherein one feature of an example in isolation or more than one feature of said example taken in combination and, optionally, in combination with one or more features of one or more further examples are further examples also falling within the disclosure of this application:

Example 1. Computer implemented systems and methods comprising:
  receiving a simulation request;
  in response to the simulation request, generating a simulation layer of an original user interface (UI) by,
    extracting information regarding a plurality of user elements of the original UI,
    creating a mesh including a plurality of positions, and copying the plurality of user elements to respective positions in the mesh:
  storing the simulation layer in a non-transitory computer readable storage medium;
  displaying the mesh overlying the original UI;
  receiving an event;
  determining that a type of the event is a simulated change to the UI; and
  changing the simulation layer in a synchronous manner responsive to the event.

Example 2. The computer implemented systems or methods of Example 1 wherein changing the simulation layer comprises adjusting a development object.

Example 3. The computer implemented systems or methods of any of Examples 1 or 2 wherein changing the simulation layer comprises adjusting a metadata extension file.

Example 4. The computer implemented systems or methods of any of Examples 1, 2, or 3 wherein the respective positions are based upon code of the original UI.

Example 5. The computer implemented systems or methods of any of Examples 1, 2, 3, or 4 wherein the respective positions are based upon the application of machine learning.

Example 6. The computer implemented systems or methods of any of Examples 1, 2, 3, 4, or 5 wherein the type of the event is determined from a hotkey or a dedicated button.

Example 7. The computer implemented systems or methods of any of Examples 1, 2, 3, 4, 5, or 6 wherein the simulation layer is implemented as at least one of a library and plug-in.

Example 8. The computer implemented systems or methods of any of Examples 1, 2, 3, 4, 5, 6, or 7 further comprising deriving from the simulation layer, a change of a development object in the original UI.

Example 9. The computer implemented systems or methods of Example 8 wherein the change of the development object is derived in an asynchronous manner.

Example 10. The computer implemented systems or methods of any of Examples 8 or 9 further comprising changing the development object in the original UI.

Figure 14:
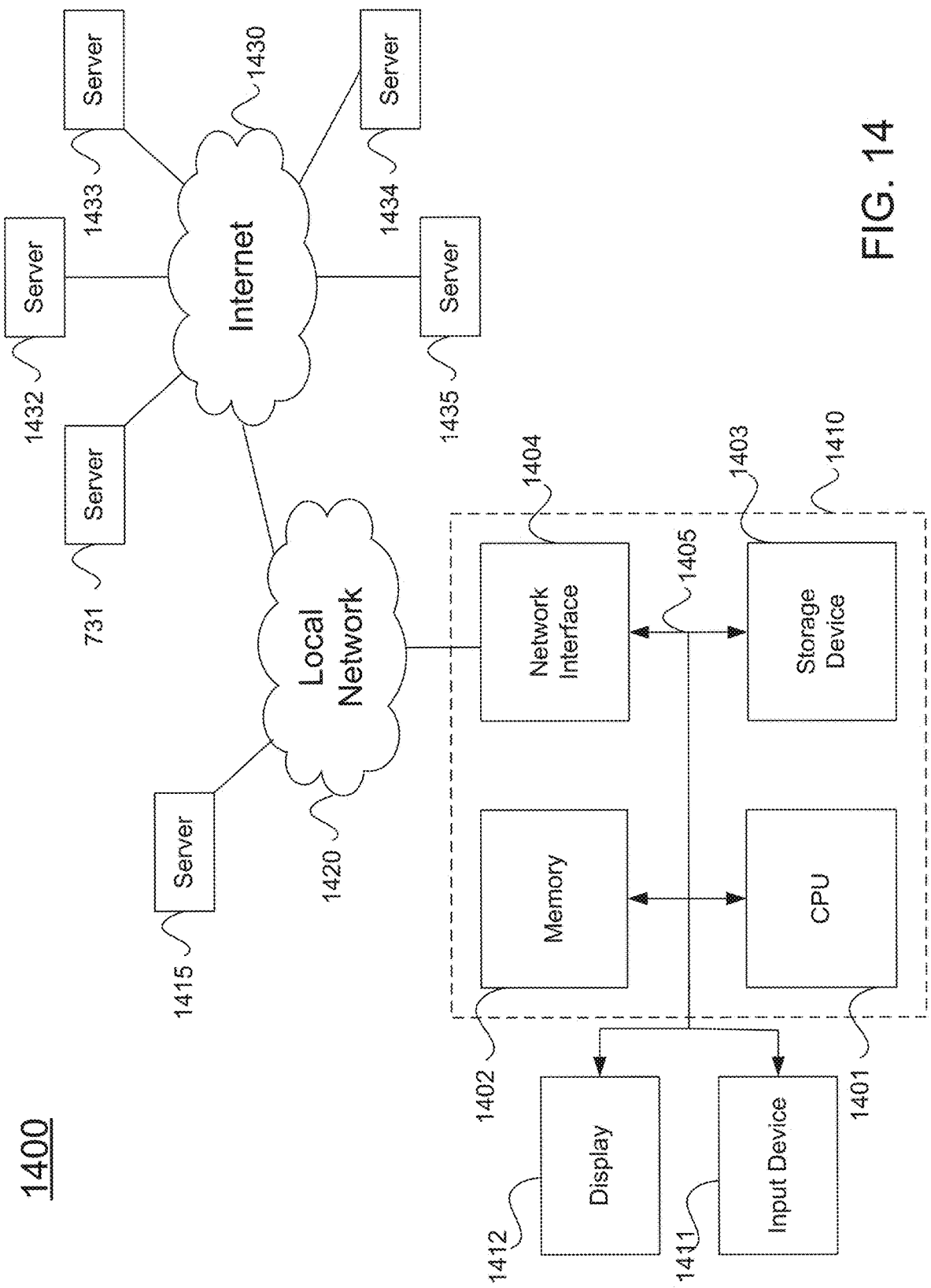
FIG. 14 illustrates an example computer system.

An example computer system 1400 is illustrated in FIG. 14. Computer system 1410 includes a bus 1405 or other communication mechanism for communicating information, and a processor 1401 coupled with bus 1405 for processing information. Computer system 1410 also includes a memory 1402 coupled to bus 1405 for storing information and instructions to be executed by processor 1401, including information and instructions for performing the techniques described above, for example. This memory may also be used for storing variables or other intermediate information during execution of instructions to be executed by processor 1401. Possible implementations of this memory may be, but are not limited to, random access memory (RAM), read only memory (ROM), or both. A storage device 1403 is also provided for storing information and instructions. Common forms of storage devices include, for example, a hard drive, a magnetic disk, an optical disk, a CD-ROM, a DVD, a flash memory, a USB memory card, or any other medium from which a computer can read. Storage device 1403 may include source code, binary code, or software files for performing the techniques above, for example. Storage device and memory are both examples of computer readable mediums.

Computer system 1410 may be coupled via bus 1405 to a display 1412, such as a Light Emitting Diode (LED) or liquid crystal display (LCD), for displaying information to a computer user. An input device 1411 such as a keyboard and/or mouse is coupled to bus 1405 for communicating information and command selections from the user to processor 1401. The combination of these components allows the user to communicate with the system. In some systems, bus 1405 may be divided into multiple specialized buses.

Computer system 1410 also includes a network interface 1404 coupled with bus 1405. Network interface 1404 may provide two-way data communication between computer system 1410 and the local network 1420. The network interface 1404 may be a digital subscriber line (DSL) or a modem to provide data communication connection over a telephone line, for example. Another example of the network interface is a local area network (LAN) card to provide a data communication connection to a compatible LAN. Wireless links are another example. In any such implementation, network interface 1404 sends and receives electrical, electromagnetic, or optical signals that carry digital data streams representing various types of information.

Computer system 1410 can send and receive information, including messages or other interface actions, through the network interface 904 across a local network 1420, an Intranet, or the Internet 1430. For a local network, computer system 1410 may communicate with a plurality of other computer machines, such as server 1415. Accordingly, computer system 1410 and server computer systems represented by server 1415 may form a cloud computing network, which may be programmed with processes described herein. In the Internet example, software components or services may reside on multiple different computer systems 1410 or servers 1431-1435 across the network. The processes described above may be implemented on one or more servers, for example. A server 1431 may transmit actions or messages from one component, through Internet 1430, local network 1420, and network interface 1404 to a component on computer system 1410. The software components and processes described above may be implemented on any computer system and send and/or receive information across a network, for example.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A method comprising:
   receiving a simulation request;
   in response to the simulation request, generating a simulation layer of an original user interface (UI) by,
      extracting information regarding a plurality of user elements of the original UI,
      creating a mesh including a plurality of positions, and copying the plurality of user elements to respective positions in the mesh;
   storing the simulation layer in a non-transitory computer readable storage medium;
   displaying the mesh overlying the original UI;
   receiving an event;
   determining that a type of the event is a simulated change to the UI; and
   changing the simulation layer in a synchronous manner responsive to the event.

2. A method as in claim 1 wherein changing the simulation layer comprises adjusting a development object.

3. A method as in claim 2 wherein changing the simulation layer comprises adjusting a metadata extension file.

4. A method as in claim 1 wherein the respective positions are based upon code of the original UI.

5. A method as in claim 1 wherein the respective positions are based upon the application of machine learning.

6. A method as in claim 1 wherein the type of the event is determined from a hotkey or a dedicated button.

7. A method as in claim 1 wherein the simulation layer is implemented as a library or as a plug-in.

8. A method as in claim 1 further comprising:
   deriving from the simulation layer, a change of a development object in the original UI.

9. A method as in claim 8 wherein the change of the development object is derived in an asynchronous manner.

10. A method as in claim 8 further comprising changing the development object in the original UI.

11. A non-transitory computer readable storage medium comprising a computer program for performing a method, said method comprising:
    receiving a simulation request;
    in response to the simulation request, generating a simulation layer of an original user interface (UI) by,
       extracting information regarding a plurality of user elements of the original UI,
       creating a mesh including a plurality of positions, and copying the plurality of user elements to respective positions in the mesh;
    storing the simulation layer in a non-transitory computer readable storage medium;
    displaying the mesh overlying the original UI;
    receiving an event;
    determining that a type of the event is a simulated change to the UI;
    changing the simulation layer in a synchronous manner responsive to the event; and
    deriving from the simulation layer, a change of a development object in the original UI.

12. A non-transitory computer readable storage medium as in claim 11 wherein deriving the change of the development object is performed asynchronously.

13. A non-transitory computer readable storage medium as in claim 11 wherein the respective positions are based upon code of the original UI.

14. A non-transitory computer readable storage medium as in claim 11 wherein the respective positions are based upon the application of machine learning.

15. A non-transitory computer readable storage medium as in claim 14 wherein changing the simulation layer comprises adjusting a development object.

16. A computer system comprising:
    one or more processors;
    a software program, executable on said computer system, the software program configured to cause a processor to:
    receive a simulation request;
    in response to the simulation request, generate a simulation layer of an original user interface (UI) by,
       extracting information regarding a plurality of user elements of the original UI,
       creating a mesh including a plurality of positions, and copying the plurality of user elements to respective positions in the mesh;
    store the simulation layer in a non-transitory computer readable storage medium;
    display the mesh overlying the original UI;
    receive an event;
    determine a type of the event is a simulated change to the UI; and
    change the simulation layer in a synchronous manner responsive to the event.

17. A computer system as in claim 16 wherein changing the simulation layer comprises adjusting a development object.

18. A computer system as in claim 17 wherein changing the simulation layer comprises adjusting a metadata extension file.

19. A computer system as in claim 16 wherein the processor is further configured to derive from the simulation layer, a change of a development object in the original UI.

20. A computer system as in claim 16 wherein the respective positions are based upon the application of machine learning.

* * * * *